US008614109B2

(12) United States Patent
Suzuki et al.

(10) Patent No.: US 8,614,109 B2
(45) Date of Patent: Dec. 24, 2013

(54) SEMICONDUCTOR LIGHT-EMITTING APPARATUS AND METHOD OF FABRICATING THE SAME

(71) Applicant: Nichia Corporation, Anan (JP)

(72) Inventors: Ryo Suzuki, Komatsushima (JP); Tadao Hayashi, Tokushima (JP)

(73) Assignee: Nichia Corporation, Anan-shi, Tokushima (JP)

( * ) Notice: Subject to any disclaimer, the term of this patent is extended or adjusted under 35 U.S.C. 154(b) by 0 days.

(21) Appl. No.: 13/687,106

(22) Filed: Nov. 28, 2012

(65) Prior Publication Data

US 2013/0146646 A1  Jun. 13, 2013

Related U.S. Application Data

(62) Division of application No. 12/615,479, filed on Nov. 10, 2009, now Pat. No. 8,450,764.

(30) Foreign Application Priority Data

Nov. 13, 2008 (JP) ................................ 2008-291259

(51) Int. Cl.
*H01L 23/00* (2006.01)

(52) U.S. Cl.
USPC .. 438/26; 257/99; 257/E33.055; 257/E33.056

(58) Field of Classification Search
USPC ................. 257/99, 100, E33.055, E33.056, 257/E33.057; 438/26
See application file for complete search history.

(56) References Cited

U.S. PATENT DOCUMENTS

2003/0189829 A1  10/2003  Shimizu et al.
2005/0156187 A1  7/2005  Isokawa et al.
2006/0261364 A1  11/2006  Suehiro et al.
2009/0159902 A1*  6/2009  Yasuda et al. .................. 257/88
2010/0047939 A1  2/2010  Kamei

FOREIGN PATENT DOCUMENTS

| EP | 1 983 571 A2 | 10/2008 |
|---|---|---|
| JP | 06-120648 | 4/1994 |
| JP | 6-349892 | 12/1994 |
| JP | 11-17225 | 1/1999 |

(Continued)

OTHER PUBLICATIONS

Office Action and English translation in JP 2008-291259 mailed Nov. 20, 2012.

*Primary Examiner* — Zandra Smith
*Assistant Examiner* — Paul Patton
(74) *Attorney, Agent, or Firm* — Nixon & Vanderhye P.C.

(57) ABSTRACT

A light-emitting apparatus has a light-emitting device and a supporting board. The light-emitting device has a pair of n-electrodes with a p-electrode therebetween, on the same plane. The supporting board includes an insulating substrate on which positive and negative electrodes are formed, opposing to the p- and n-electrodes of the light-emitting device, respectively. Bonding members bond the p- and n-electrodes with the positive and negative electrodes, respectively. The positive electrode on the supporting board is formed within the width region of the p-electrode and narrower in width than the width of the p-electrode, in a cross-section along a line extending through the pair of n-electrodes. The negative electrodes oppose to the n-electrodes, respectively, with the same widths, or with that side face of each of the negative electrodes which faces the positive electrode being retracted outwardly from that side face of each of the n-electrodes which faces the p-electrode.

24 Claims, 5 Drawing Sheets

(56) References Cited

FOREIGN PATENT DOCUMENTS

| | | |
|---|---|---|
| JP | 11-330131 | 11/1999 |
| JP | 2003-324216 | 11/2003 |
| JP | 2005-38892 | 2/2005 |
| JP | 2005-51233 | 2/2005 |
| JP | 2005-150386 | 6/2005 |
| JP | 2007-059781 | 3/2007 |
| JP | 2008-4948 | 1/2008 |
| WO | WO 01/80322 | 10/2001 |
| WO | WO 03/077312 | 9/2003 |
| WO | WO 2007/141763 | 12/2007 |

* cited by examiner

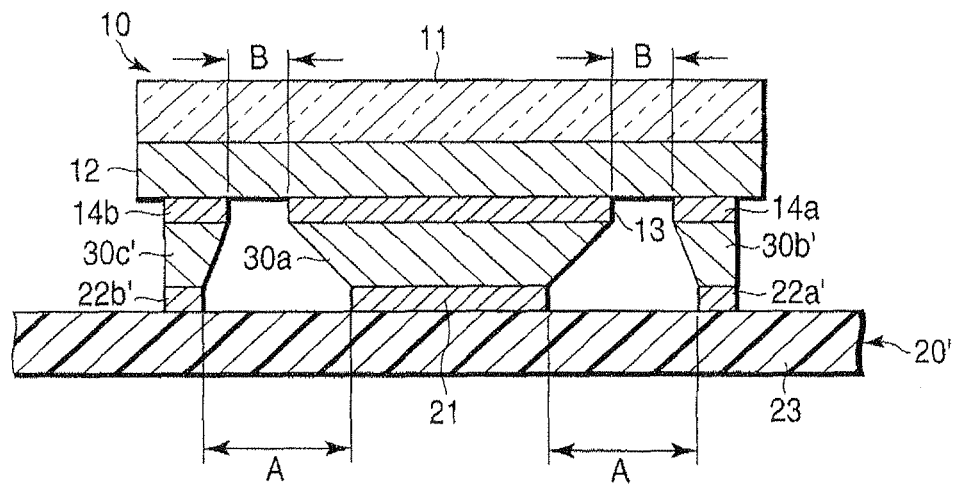
F I G. 7
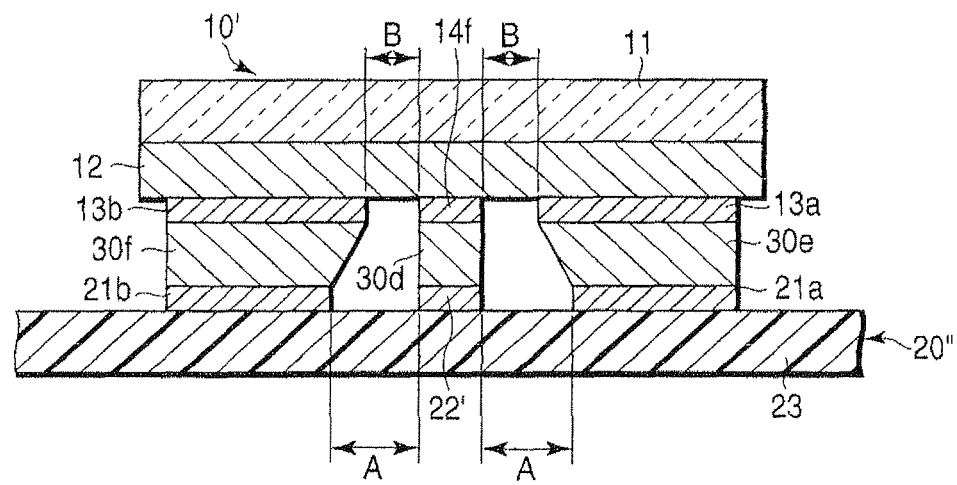
F I G. 8

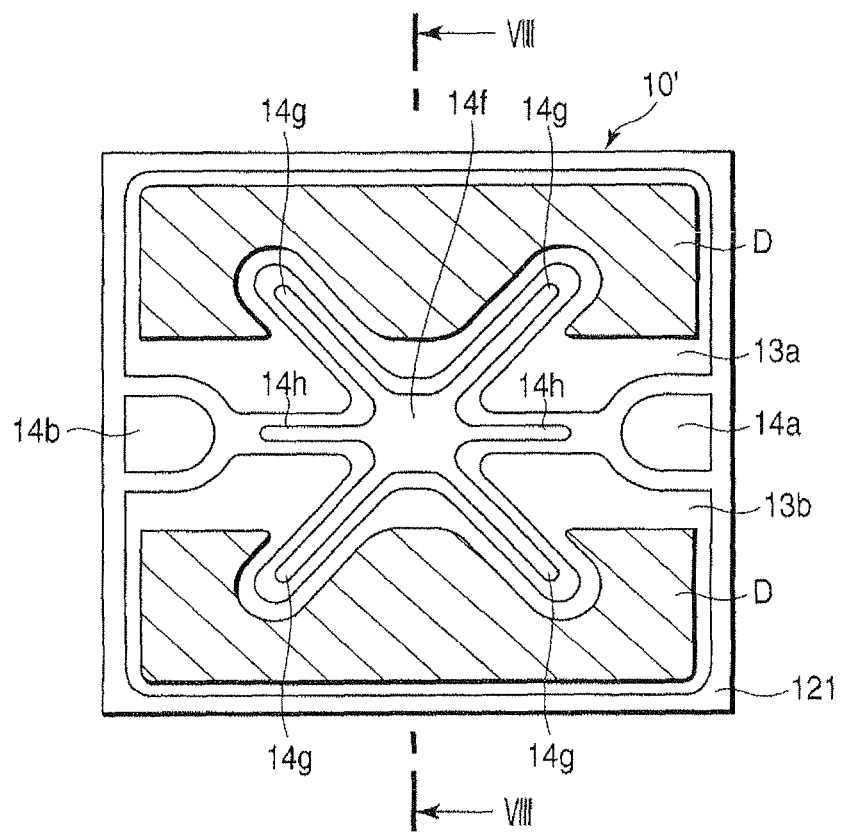
F I G. 9
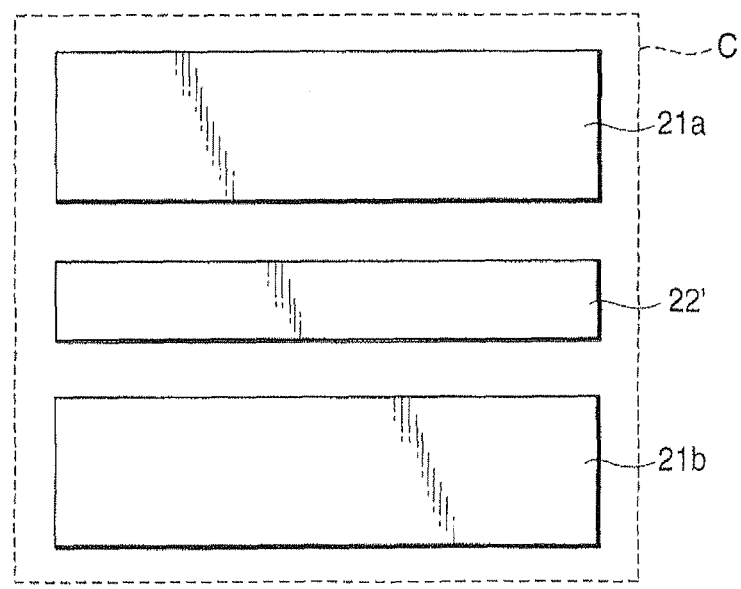
F I G. 10

SEMICONDUCTOR LIGHT-EMITTING APPARATUS AND METHOD OF FABRICATING THE SAME

CROSS-REFERENCE TO RELATED APPLICATIONS

This application is a divisional application of Ser. No. 12/615,479 filed Nov. 10, 2009, now U.S. Pat. No. 8,450,764, which in turn is based upon and claims the benefit of priority from prior Japanese Patent Application No. 2008-291259, filed Nov. 13, 2008, the entire contents of each of which are incorporated herein by reference.

BACKGROUND OF THE INVENTION

1. Field of the Invention

The present invention relates to a semiconductor light-emitting apparatus and a method of fabricating the same, and more specifically, to a semiconductor light-emitting apparatus in which a semiconductor light-emitting device is mounted on a supporting board by bonding members.

2. Description of the Related Art

A surface-mounted light-emitting apparatus using a semiconductor light-emitting device chip (hereinafter referred to as "light-emitting device") such as a light-emitting diode (LED) or a laser diode is known in the art. As such an apparatus, there is known an apparatus in which a light-emitting device having p- and n-electrodes on the same side is flip chip-mounted on an insulative supporting board on which a wiring pattern including positive and negative electrodes is formed, in order to enhance the light extraction efficiency. In this case, a solder paste, such as an AuSn solder paste, is applied on a predetermined area of the supporting board on which the positive and negative electrodes are formed, a light-emitting device provided with an Au bump is flip chip-mounted on the supporting board, and then, the solder is reflowed. Peripheral portions of the light-emitting device and the bump are sealed with a light-transmitting sealing resin.

The light-emitting apparatus of the above structure exhibits strong bonding strength and has a superior reliability, since the light-emitting device and the supporting board is bonded with the Au bump, which has a certain level of height. However, because of the height of the bump, the sealing resin intervenes between the light-emitting device and the supporting board in a large amount. When the intervening resin is subject to thermal stress, the stress progresses from the wiring pattern to the light-emitting device. When the amount of the intervening resin is large, or when the light-emitting apparatus of the above structure is used in an environment involving sever change in temperatures, this stress becomes so strong as to adversely affect the adhesion between the light-emitting device and the sealing resin or the bonding between the light-emitting device and the wiring pattern, resulting in lowering of reliability by the absorption of moisture and in poor bonding of the light-emitting device, leading to non-lighting of the light-emitting device.

On the other hand, a light-emitting apparatus has been proposed in the art, in which a light-emitting device is mounted on a supporting board by means of a bonding member other than an Au bump. However, when the distance between the light-emitting device and the supporting board becomes small, it is necessary to take measures to prevent short-circuiting between the p- and n-electrodes on the light-emitting device and between the positive and negative electrodes on the supporting board.

Jpn. Pat. Appln. KOKAI Publication No. 2005-38892 discloses, for the purpose of preventing short-circuiting between p- and n-electrodes on a light-emitting device and between p-type and n-type compound semiconductor layers, forming a recess or groove in a boundary region between the positive and negative electrodes on the supporting board. The solder, heated and compressed between the light-emitting device and the supporting board and tending to run off from between the light-emitting device and the supporting board, flows into the recess, whereby the short-circuiting between the positive and negative electrodes by the solder is prevented. However, when the distance between the p- and n-electrodes is made small to increase output power or when the n-electrode on the light-emitting device is made smaller, volume of the recess sufficient to prevent the short-circuiting can not be acquired, leading to the short-circuiting between the two electrodes on the light-emitting device by the solder.

Further, Jpn. Pat. Appln. KOKAI Publication No. 2008-4948 discloses, in FIG. 1, that in a face down-mounted LED device, the distance between positive and negative electrodes on a submount is broader than the distance between p- and n-electrodes on a light-emitting device. However, if the p-electrode on the light-emitting device is arranged near the positive electrode on the submount, the p-electrode on the light-emitting device is short-circuited with the negative electrode on the submount when the bonding is effected by means of an electrically conductive material.

BRIEF SUMMARY OF THE INVENTION

It is an object of the present invention to provide a light-emitting apparatus in which electrodes of a light-emitting device and electrodes of a supporting board are bonded with a bonding member or members and which can prevent unnecessary short-circuiting between the electrodes by the bonding member(s) and thus can be fabricated with good yield, as well as a method of fabricating such a light-emitting apparatus.

According to a first invention, there is provided a method of fabricating a semiconductor light emitting apparatus comprising a semiconductor light-emitting device having an electrode formation plane and comprising p- and n-electrodes in the electrode formation plane; a supporting board comprising an insulating substrate which has an electrode formation plane corresponding to the electrode formation plane of the light-emitting device and on which positive and negative electrodes are formed so as to oppose to the p- and n-electrodes of the light-emitting device, respectively; and bonding members bonding the p- and n-electrodes with the positive and negative electrodes, respectively, the method comprising: supplying a bonding material in a paste state onto the electrode formation plane of the supporting board including the positive and negative electrodes; placing the light-emitting device on the bonding material such that the p- and n-electrodes of the light-emitting device contact the bonding material; and heating and melting the bonding material, thereby bonding the p- and n-electrodes on the light emitting device with the positive and negative electrodes on the supporting board, respectively.

According to a second invention, there is provided a semiconductor light-emitting apparatus comprising: a semiconductor light-emitting device having an electrode formation plane and comprising a p-electrode and a pair of n-electrodes with the p-electrode therebetween, formed in the electrode formation region; a supporting board supporting the light-emitting device and comprising an insulating substrate which has an electrode formation plane corresponding to the electrode formation plane of the light-emitting device and on which a positive and a pair of negative electrodes are formed in the electrode formation plane of the supporting board, electrically isolated from each other and opposing to the p- and n-electrodes on the light-emitting device, respectively; and bonding members bonding the p-electrode and the n-electrodes of the light-emitting device with the positive electrode and the negative electrodes of the supporting board, respectively; the p-electrode of the light-emitting device being formed substantially entirely on the electrode formation plane of the light-emitting device, except for those portions on which the n-electrodes are formed, and being eutectically bonded with the positive electrode of the supporting board; the positive electrode on the supporting board being formed within a width region of the p-electrode and narrower in width than the width of the p-electrode, in a cross-section along a line extending through the pair of n-electrodes on the light-emitting device; the negative electrodes on the supporting board opposing to the n-electrodes of the light-emitting device, respectively, with the same widths, or with that side face of each of the negative electrodes which faces the positive electrode being retracted outwardly from that side face of each of the n-electrodes which faces the p-electrode.

According to a third invention, there is provided a semiconductor light-emitting apparatus comprising: a semiconductor light-emitting device having an electrode formation plane and comprising an n-electrode and a pair of p-electrodes with the n-electrode therebetween, formed in the electrode formation region; a supporting board supporting the light-emitting device and comprising an insulating substrate which has an electrode formation plane and on which a negative and a pair of positive electrodes are formed in the electrode formation plane of the supporting board, electrically isolated from each other and opposing to the n- and p-electrodes on the light-emitting device, respectively; and bonding members bonding the p-electrode and the n-electrodes on the light-emitting device with the positive electrode and the negative electrodes on the supporting board, respectively; that side face of each of the positive electrodes which faces the negative electrode being retracted outwardly from that side face of each of the p-electrodes which faces the n-electrode, and the negative electrode of the supporting board being opposed to the n-electrode on the light-emitting device with the same width or with a narrower width in a cross-section along a line extending through the pair of p-electrodes on the light-emitting device.

BRIEF DESCRIPTION OF THE SEVERAL VIEWS OF THE DRAWING

FIG. 7 is a cross-sectional view schematically illustrating a semiconductor light-emitting apparatus according to a second embodiment of the present invention;

FIG. 8 is a cross-sectional view schematically illustrating a semiconductor light-emitting apparatus according to a third embodiment of the present invention;

FIG. 9 is a plan view illustrating an example of an electrode pattern on the electrode formation plane of the light-emitting device illustrated in FIG. 8; and FIG. 10 is a plan view illustrating an example of an electrode pattern on the electrode formation plane of the supporting board illustrated in FIG. 8.

DETAILED DESCRIPTION OF THE INVENTION

Some of embodiments of the present invention will be described below with reference to the accompanying drawing FIGURES. However, these embodiments are only exemplary, embodying the technical idea of the present invention, and are not intended to limit the present invention. Further, these embodiments are not intended to the materials or elements recited in the appended claims to those describe in these embodiments. In particular, the dimensions, materials, shapes or other relative arrangements of the members or elements described in these embodiments are not intended to limit the invention thereto unless so specified therein, and are only exemplary. Note that the sizes and the positional relationship illustrated in the accompanying drawing FIGURES are not to scale, and are exaggerated in order to described them more clearly in some cases. Further, in the following descriptions, the same or similar members or elements are indicated by the same or similar reference symbols, and the detail explanation for them are omitted in some cases. Furthermore, a plurality of elements constituting the invention may be constructed from one member, or a plurality of functions of a single element constituting the invention may be shared by a plurality of members.

First Embodiment

Figure 1:
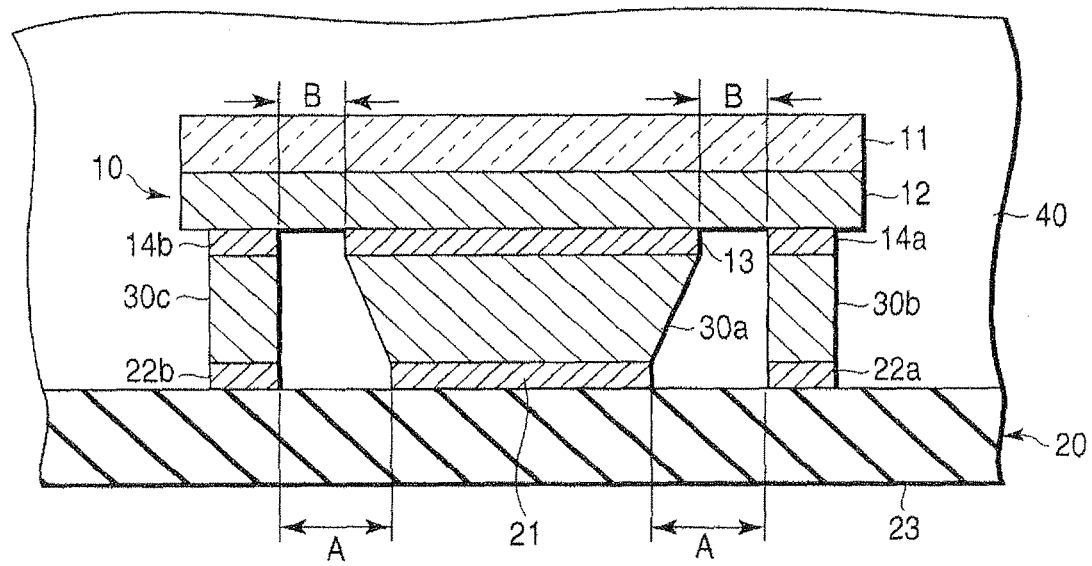
FIG. 1 is a cross-sectional view schematically illustrating a semiconductor light-emitting apparatus according to a first embodiment of the present invention.
Figure 2:
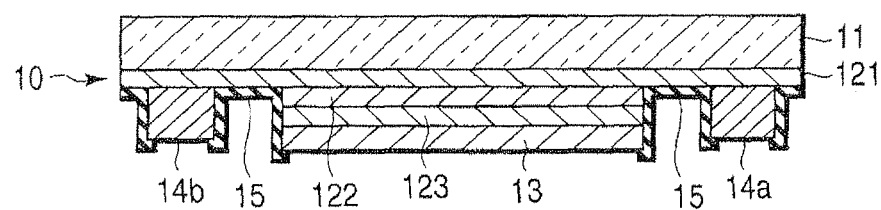
FIG. 2 is a cross-sectional view schematically illustrating the semiconductor light-emitting device constituting the semiconductor light-emitting apparatus illustrated in FIG. 1.
Figure 3:
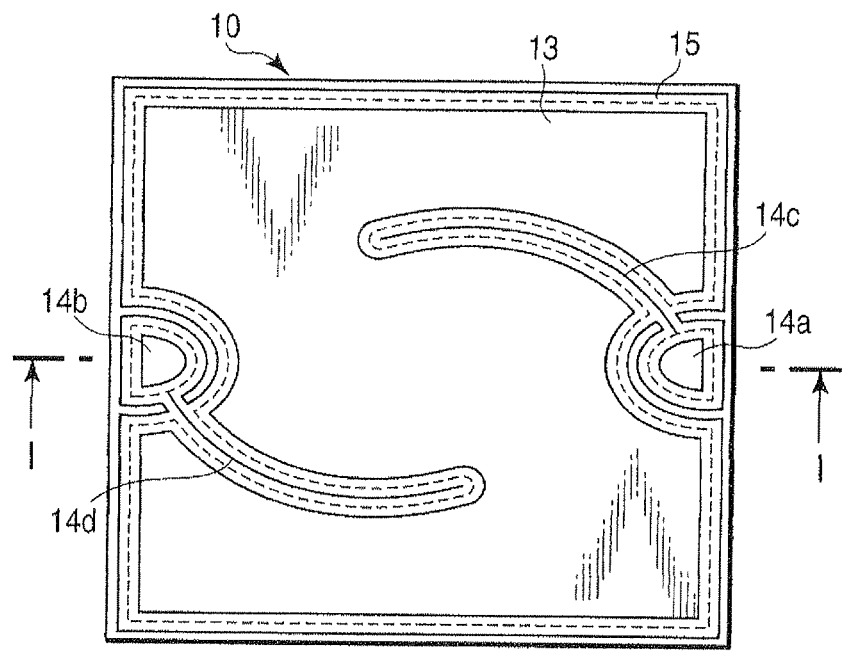
FIG. 3 is a plan view illustrating the plane in which the electrodes of the semiconductor light-emitting device illustrated in FIG. 2 are formed.
Figure 4:
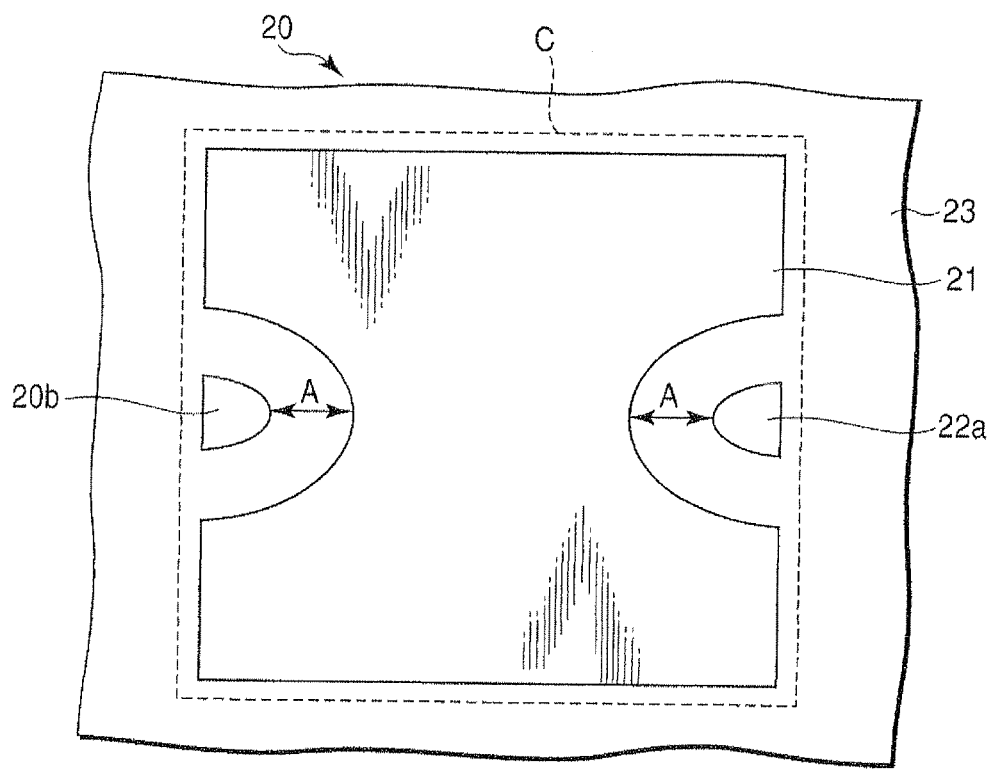
FIG. 4 is a plan view illustrating the plane in which the electrodes of the supporting board constituting the semiconductor light-emitting apparatus illustrated in FIG. 1 are formed.

FIG. 1 is a cross-sectional view schematically illustrating the main part of a semiconductor light-emitting apparatus according to a first embodiment of the invention. FIG. 2 is a cross-sectional view schematically illustrating the semiconductor light-emitting device constituting the semiconductor light-emitting apparatus illustrated in FIG. 1. FIG. 3 is a plan view illustrating the plane in which the electrodes of the semiconductor light-emitting device illustrated in FIG. 2 are formed. FIG. 4 is a plan view illustrating the plane in which the electrodes of the supporting board constituting the semiconductor light-emitting apparatus illustrated in FIG. 1 are formed. Here, FIG. 1 (also FIG. 2) corresponds to a cross-section along the line I-I of FIG. 3 which extends through a pair of n-electrodes and p-electrode illustrated in FIG. 3.

The semiconductor light-emitting apparatus illustrated in FIG. 1 comprises a semiconductor light-emitting device 10 and a supporting board 20. If necessary, the light-emitting device 10 may be sealed by a light-transmitting sealing member 40 in order to protect the light-emitting device 10 from outside force from the outside environment, dusts and moisture, and the like. The sealing member is filled also in the space between the light-emitting device 10 and the supporting board 20.

The light-emitting device 10 comprises a light-transmitting insulative substrate 11, a semiconductor laminate structure 12 including an n-type semiconductor layer, an active (or light-emitting) semiconductor layer and a p-type semiconductor layer, formed on the substrate 11, and a p-electrode 13 and a pair of main n-electrode 14a and 14b, formed on the laminate structure 12.

As illustrated in more detail in FIG. 2, the semiconductor laminate structure 12 illustrated in FIG. 1 comprises an n-type semiconductor layer 121, formed on the substantially entire surface of the substrate 11, an active layer 122, formed on the substantially entire surface of the n-type semiconductor layer 121, and a p-type semiconductor layer 123, formed on the substantially entire surface of the active layer 122. The p-type semiconductor layer 123 and the active layer 122 are partially removed to expose portions of the surface of the n-type semiconductor layer 121, for forming the n-electrodes 14a and 14b. It is preferred that an insulating protective film 15 (see FIGS. 2 and 3; not illustrated in FIG. 1) is formed on the exposed surface portion of the n-type layer 121, except for the surface portions on which the n-electrodes 14a, 14b are formed. The protective film 15 also covers the side surfaces of the n-electrodes 14a and 14b, the side surface of the p-electrode 13, the peripheral portion of the surface of each of the n-electrodes 14a and 14b, and the peripheral portion of the surface of the p-electrode 13. The protective film 15 may be formed of an oxide (e.g., silicon dioxide) or a nitride (e.g., silicon nitride). The thickness of the protective film 15 may be, e.g., 0.2 μm or more and usually 1.5 μm or less. Incidentally, in the state of FIG. 2, usually, the lower surface of the p-electrode 13 protrudes slightly (e.g., about 1-2 μm) from the lower surface of each of the n-electrodes 14a and 14b. However, this protrusion does not cause any problem for the purposes of the present invention.

The light-emitting device 10 may be any semiconductor light-emitting device. For example, a semiconductor laser or a semiconductor LED may be used. When the light-emitting device 10 is an LED, the semiconductor laminate structure 12 comprising the n-type semiconductor layer 121, the active layer 122 and the p-type semiconductor layer 123 is preferably formed on a sapphire substrate (light-transmitting insulative substrate 11), which makes it possible to grow nitride semiconductor layers of good crystal quality with a high productivity. These semiconductor layers may be formed of semiconductor materials known in the art, for example, nitride semiconductor materials. For example, in the case of a blue light-emitting LED, the n-type layer 121 may be formed of GaN doped with an n-type impurity (e.g., Si), the active layer 122 is formed of $In_xAl_yGa_{1-x-y}N$ (where $0 \leq x$, $0 \leq y$, $x+y \leq 1$) with or without dopant, and the p-type layer 123 may be formed of GaN doped with a p-type impurity (e.g., Mg). Compound semiconductors such as ZnSe may also be used. If the semiconductor material is a compound semiconductor material, the emission wavelengths can be adjusted by the mixed crystal ratio.

The p-electrode 13 on the light-emitting device 10 is preferably formed of an electrically conductive material which can reflect the light from the light-emitting device toward the light-transmissive substrate 11. Such a conductive material includes, for example, a single metal such as Ag, Al or Rh, an Rh—Ir alloy, or a Ti/Al/Ni/Au laminate with Au constituting the outermost layer. The n-electrodes 14a and 14b may each be formed of a laminate such as a Ti/Al/Ni/Au laminate with Au constituting the outermost layer, a W/Al/W/Pt/Au laminate with Au constituting the outermost layer, or an Ni—Si—Cu alloy/W/Pt/Au/Ni laminate with Ni constituting the outermost layer.

In order to realize a white light-emitting apparatus, a blue light-emitting device may be used as the light-emitting device 10, and a phosphor material which can be excited by the blue light from the blue light-emitting device to emit yellow light, such as YAG phosphor material (rare earth aluminate phosphor activated mainly by a lanthanoid element such as Ce) may be contained in the sealing member 40, for example. In this case, the YAG phosphor partially absorbs the light emitted from the blue light-emitting device to emit yellow light, which is complementary to the blue light. The yellow light is mixed with the blue light from the blue light-emitting device, turning into white light, which outgoes outside from the light-emitting apparatus. Alternatively, a phosphor which can be excited by the blue light from the blue light-emitting device to emit red light, such as Eu and/or Cr-activated nitrogen-containing $CaO-Al_2O_3-SiO_2$ phosphor, may be used as a phosphor to be contained in the sealing member 40. In this case, the phosphor partially absorbs the light emitted from the blue light-emitting device to emit red light, which is complementary to the blue light. The red light is mixed with the blue light from the blue light-emitting device, turning into white light, which outgoes outside from the light-emitting apparatus.

Returning to FIG. 1, the supporting board 20 comprises an insulating substrate 23, and a positive electrode 21 and two negative electrode 22a and 22b, formed on the substrate 23. These electrodes 21, 22a and 22b are formed, for example, as parts of a wiring pattern (not illustrated). The p-electrode 13 on the light-emitting device 10 faces, or opposes to, the positive electrode 21, while the two n-electrodes 14a and 14b face, or oppose to, the two negative electrodes 22a and 22b, respectively. The p-electrode 13 and the positive electrode 21, opposing to each other, are electrically connected through a bonding member 30a. On the other hand, the n-electrode 14a and the negative electrode 22a, opposing to each other, are electrically connected through a bonding member 30b, while the n-electrode 14b and negative electrode 22b, opposing to each other, are electrically connected through a bonding member 30c. The surface of the insulating substrate 23 may be covered with an insulating material, except for the portions on which the electrodes 21, 22a and 22b are formed, but is usually exposed, except for the portions on which the electrodes 21, 22a and 22b.

The insulating substrate 23 may be formed of a ceramic material such as alumina ($Al_2O_3$) or AlN. As the supporting board 20, use may be made of a lead frame type one, which comprises an insulating substrate formed of a thermoplastic or a thermosetting resin, on which a lead frame is formed. The surface of the lead frame, other than those surface portions which should be exposed so as to act as the electrodes, is covered with a resin. In this case, it is preferable to use materials small in the difference in thermal expansion coefficient. Such materials can alleviate the thermal stress generated between the supporting board and the light-emitting device during manufacture or use.

The material for the positive and negative electrodes 21, 22a and 22b is not limited, as long as it has an electrical conductivity. It is preferable to use Au, or a silver white metal, in particular, Ag or Al, which has a high reflectivity. Such a material reflects the light from the light-emitting device in the direction opposite to the supporting board, enhancing the light extraction efficiency of the light-emitting apparatus, if the positive and/or negative electrode is slightly exposed from the bonding members. In the case where a metal is used as an electrically conductive material, the metal is preferably selected in view of adhesion with the bonding member or wettability with the bonding member. One embodiment of a method for forming the positive and negative electrodes includes forming a photoresist pattern on those areas of the insulating substrate of the supporting board where the electrodes are not formed, and depositing a layer or layers of conductive material, for example, a Ti layer in thickness of 10 nm and an Au layer in thickness of 1 µm thereon, by a suitable method such as electron beam deposition, sputtering or plating. Thereafter, the photoresist pattern is removed, and the conductive materials formed thereon are lifted off at the same time. As the negative electrodes, use may be also made of a laminate such as Ti/Au, Ni/Au, or Al/Au. Usually, the positive and negative electrodes are formed of the same conductive material with the same thickness at the same time.

Further, the supporting board 20 may be a co-fired board, which can be prepared by forming electrodes on a green insulating sheet (a paste containing particles of insulating material and a binder), for example, a green ceramic sheet, and baking the sheet, or a post-fired board, which can be prepared by baking the green insulating sheet, and then forming electrodes on the baked insulating sheet (substrate). The co-fired board can be mass-produced at a low cost, though it is slightly inferior in the electrode pattern accuracy.

The bonding members 30a-30c may be any bonding members having electrical conductivity, and may be formed from a metal which can be melted by heating, an electrically conductive paste, a solder paste material, sinterable Ag particles, a paste having anisotropic conductivity, or the like. Particularly, taking the wettability with, and adherence to, the electrodes on the light-emitting device and on the supporting board into consideration, it is preferable to use an alloy containing any of Au, Ag, Cu, Si, Sn, Pb and In, in particular, a eutectic material selected from AuSn, SnAgCu, AuSi, SnAgBi, SnAgBiCu, SnCu, SnBi and SnPbIn. Such a eutectic material can create eutectic bond.

The sealing member 40 is preferably arranged such that the distance between the outer edge of the light-emitting device 10 and the outer periphery of the sealing member are substantially equal in the plane including the surface of the light-emitting device. This arrangement makes it possible to make the light-emitting plane of the device small, leading to a uniform emission. The shape of the sealing member 40 may be any suitable shape, such as convex, concave, dome, or a semi-ellipse, cube or triangular prism viewed from the light emission observation plane. For example, if the sealing member 40 is shaped into a convex lens or concave lens, a lens effect can be obtained. The sealing member 40 may be formed of an organic material such as an epoxy resin, an acrylic resin, an imide resin or a silicone resin, or an inorganic material such as a glass, all of which is superior in light fastness and in light transmissivity. Further, the sealing member 40 may contain a light-diffusing material (particles) such as aluminum oxide, barium oxide, barium titanate, silicon oxide or the like, in order to diffuse the light from the light-emitting device. In addition, the sealing member 40 may be added with a coloring agent so as to have a filtering effect to cut the outside light and to cut unnecessary wavelengths of the light from the light-emitting device. Furthermore, the sealing member 40 may contain a phosphor material excited by the light emitted from the light-emitting device to emit fluorescence, as described above. Also, the sealing member 40 may contains fillers which can alleviate internal stresses within the sealing resin.

Referring now to FIG. 3, the light-emitting device 10 is a quadrangle in plan in this embodiment, but may be of the other polygon, an ellipsoid, a circle in plan. The pair of n-electrodes (main n-electrodes) 14a and 14b are disposed on the both sides of the p-electrode 13 with the p-electrode 13 centered. In other words, the two n-electrodes are disposed with the p-electrode 13 therebetween. The p-electrode 13 is significantly larger than the n-electrodes 14a and 14b, in order to increase the light-emitting efficiency of the light-emitting device 10. The p-electrode 13 is, for example, of a quadrangular shape in which each of the two opposing sides of the quadrangle is curved inwardly, describing an arc. That is, the p-electrode 13 has a constricted portion. On the other hand, each of the main n-electrodes 14a and 14b is of a semi-elliptic shape, and these two n-electrodes are in line symmetry with respect to that center line of the above-noted quadrangle which is orthogonal to the line I-I. Further, the p-electrode 13 is arranged spaced apart from each of the main n-electrodes 14a and 14b by a distance B (see FIG. 1). Further, in order to enhance the light-emitting efficiency, very fine auxiliary n-electrodes 14c and 14d in the form of an arc may be formed, extending from the main n-electrodes 14a and 14b into the region of the p-electrode 13. Needless to say, there auxiliary n-electrodes are not contacted with the p-electrode 13. It should be noted that the n-electrodes are often made as small as possible and at the same time, and the distance between the p- and n-electrodes is minimized, in order to obtain the possible largest light emission area of the light-emitting apparatus. However, the p and n-electrodes are required to be spaced apart by an appropriate distance to prevent short-circuiting therebetween. Incidentally, as shown in FIG. 3, the p-electrode 13 is formed, substantially entirely covering the electrode formation plane of the device 10, except for those portions on which the n-electrodes are formed.

Referring to FIG. 4, the positive electrode 21 on the supporting board 20 is of a quadrangular shape in which each of the central portions of the two opposing sides of the quadrangle is curved inwardly, describing an arc, like the p-electrode 13 on the light-emitting device 10. That is, the positive electrode 21 has a constricted portion. On the other hand, each of the negative electrodes 22a and 22b is of a semi-elliptic shape, like the main n-electrodes of the light-emitting device 10. Further, the positive electrode 21 is arranged spaced apart from each of the negative electrodes 22a and 22b by a distance A (see also FIG. 1). Incidentally, in order to illustrate the opposed state of the positive and negative electrodes 21, 22a and 22b, and the electrode formation plane of the light-emitting device 10 in FIG. 3, the outer periphery of the electrode formation plane of the light-emitting device 10 is shown by the dashed line C in FIG. 4. Here, in the present invention, the electrode formation plane of the light-emitting device refers to a surface region in which the p- and n-electrodes are formed, corresponds to the surface of the substrate of the light-emitting device, and substantially corresponds to the surface of the n-type layer. More specifically, the electrode formation plane of the light-emitting device 10 is a plane observed when the p-type layer 123 on which the p-electrode 13 is formed and the n-type layer 121 on which the n-electrodes 14a and 14b are formed, of the semiconductor laminate structure 12, is viewed in plan, and is considered as a plane, though the p-type layer 123 protrudes from the n-type layer 121. Further, the electrode formation plane of the supporting board is a surface region on the insulating substrate in which the positive and negative electrodes are formed, and which is positioned within a surface region on the insulating substrate, opposing to the electrode formation plane of the light-emitting device. Usually, the electrode formation planes of the light-emitting device and the supporting board have the substantially the same surface area. In other word, usually, the electrode formation plane of the supporting board coincides with a plane formed by projecting the image of the electrode formation plane of the light-emitting device vertically onto the surface of the insulating substrate with the same magnification.

More specifically, the positive electrode 21 on the supporting board 20 is disposed such that it is positioned within that surface region on the insulating substrate 23 which opposes to the p-electrode 13 of the light-emitting device 10 (in other words, within a plane formed by projecting the image of the p-electrode 13 vertically onto the surface of the insulating substrate 23 with the same magnification. In addition, the positive electrode 21 has a smaller width than that of the p-electrode 13 in the cross-section along the line I-I which extend through the main n-electrodes and the p-electrode within the width region of the p-electrode of the light-emitting device (see FIG. 1).

On the other hand, the negative electrodes 22a and 22b have the same areas with the n-electrodes 14a and 14b, respectively, and are arranged such that they oppose to the n-electrodes 14a and 14b with the same widths in the cross-section along the line I-I. In other words, the bonding area of the positive electrode 21 on the supporting board with the bonding member 30a is smaller than the bonding area of the p-electrode 13 on the light-emitting device 10 with the bonding member 30a, while the bonding areas of the negative electrodes 22a and 22b with the bonding members 30b and 30c are the same as the bonding areas of the n-electrode 14a and 14b with the bonding member 30b and 30c, respectively. Further, in the cross-section along the line I-I, the distance A between the positive electrode and each of the negative electrodes is longer than the distance B between the p-electrode and each of n-electrodes. The spaces between the positive and negative electrodes on the supporting board oppose to the spaces between the p- and n-electrodes on the light-emitting device, respectively.

Incidentally, it is preferable that the center of the positive electrode 21 of the supporting board 20 substantially coincides with the center of the p-electrode 11 of the light-emitting device 10. With this arrangement, it is possible to fix the light-emitting device 10 on the supporting board 20 more accurately and stably. Further, in this embodiment, it is preferable that the periphery of the electrode formation plane of the light-emitting device 10 substantially coincides with the periphery of the electrode formation plane of the supporting board 20. With this arrangement, the electrodes on the light-emitting device can be accurately disposed with respect to the electrodes on the supporting board. In a specific embodiment, the light-emitting device 10 has an electrode formation plane of a quadrangular planar shape, and the p-electrode 11 thereon and the positive electrode 21 of the supporting board have a deformed quadrangular planar shape as described previously. In this specific embodiment, the four corners of the electrode formation plane of the light-emitting device 10 are arranged so as to substantially coincide with the four corners of the positive electrode 21 of the supporting board 20, respectively.

Here, one embodiment of a method of fabricating a semiconductor light-emitting apparatus according to the present invention will be described with reference to FIG. 1. The fabrication method comprises supplying a paste comprising a bonding material (e.g., a solder paste containing the eutectic material described above) onto the substantially entire surface of the electrode formation plane of the supporting board 20, including the positive electrode 21 and the negative electrodes 22a and 22b, by means of a dispenser or by stamping, contacting the light-emitting device with the solder paste such that the p-electrode 13 and the main n-electrodes 14a and 14b oppose to the positive electrode 21 and negative electrodes 22a and 22b, respectively, and heating and melting (reflowing) the paste and hence the bonding material. This heat melting can be carried out in a reflow furnace. The melted bonding material wets strongly with the conductive material constituting the electrodes, but does not substantially wet the (compound) semiconductors and the insulating materials. Thus, the melted bonding material does not extend onto the exposed surface of the insulating substrate 23 (or repelled by the insulating material). In addition, the melted bonding material wets the entire surface of the p-electrode 13 and the entire surface of the n-electrode 14a and 14b (as well as the n-electrode 14c and 14d), but does not extend onto (or repelled by) the semiconductor layer or layers exposed from these electrodes (or the insulating protective film 15 if it is formed). The protective film 15 repels the conductive paste more than the compound semiconductors. In this way, the bonding members 30a-30c bond with the positive and negative electrodes on the supporting board 20 and with the p- and n-electrodes on the light-emitting device 10, respectively. The melted bonding material is solidified by cooling into the bonding members 30a to 30c.

As described above, if the width of the constricted portion of the positive electrode 21 on the supporting board 20 is smaller than the width of the constricted portion of the p-electrode 13 on the light-emitting device 10, the bonding member 30a bonding the positive electrode 21 and the p-electrode 13 has a side tapered in the cross-section along the line I-I, as illustrated in FIG. 1. As a result, those electrodes on the light-emitting device and on the supporting board which require an electrical connection can be bonded by the bonding members, as desired, and those electrodes on the light-emitting device and on the supporting board which must not be electrically connected are prevented from short-circuiting caused by the bonding members. Incidentally, if the bonding members 30a-30c are made from, for example, an AuSn solder, the electromigration of Sn is relatively readily generated during lightening of the apparatus. However, when the bonding members are formed so as to have a tapered side face as in this embodiment, those electrodes which must not be electrically connected can be prevented from short-circuiting if the electromigration is generated during the lightening of the light-emitting apparatus.

Further, since the periphery of the electrode formation plane of the light-emitting device 10 substantially coincides with the periphery of the electrode formation plane of the supporting board 20, the electrodes on the light-emitting device 10 can be accurately positioned with respect to the electrodes on the supporting board 20. Thus, those electrodes on the light-emitting device and on the supporting board which require an electrical connection can be bonded by the bonding members, as desired, and those electrodes on the light-emitting device and on the supporting board which must not be electrically connected are prevented from short-circuiting caused by the bonding members.

In order to more assuredly establish the self-alignment noted above, it is preferable to appropriately set the distances A between the positive electrode 21 and the negative electrodes 22a and 22b on the supporting board 20, the distances B between the p-electrode 13 and the n-electrode 14a and 14b of light-emitting device 10, the distance between the p-electrode 13 and the positive electrode 21 or the thickness of the bonding members, and the thickness of the electrodes, which will be describe below.

The distances A between the positive electrode 21 and the negative electrodes 22a and 22b on the supporting board are preferably set within a range of 10 µm or more, but 150 µm or less, more preferably within a range of 10 µm or more, but 40

μm or less. Further, the distances B between the p-electrode 13 and the n-electrodes 14a and 14b on the light-emitting device 10 are preferably set within a range of 10 μm or more, but 40 μm or less. In a particular case where the supporting board is a co-fired ceramic board, each of the distances A between the positive and negative electrodes is preferably 50 μm or more, but 150 μm or less. In this case, the self-alignment will be established more assuredly, and the generation of the electromigration will be further suppressed.

When the bonding members are formed of a solder, the thickness of the solder (or more precisely, the distance between the p-electrode 13 and the positive electrode 21) is preferably more than 10 μm, particularly 20 μm or more, in view of bondability with the electrodes. If the thickness of the solder is 10 μm or less, voids are generated in the solder material which is flattened out when the light-emitting device is placed on the supporting board, tending to result in poor bonding with the electrodes. The thickness of the solder is preferably 40 μm or less.

Further, the thickness of the each of the electrodes 21 and 22 on the supporting board 20 is preferably set within a range of 5 μm or more, but 50 μm or less, particularly within a range of 10 μm or more, but 30 μm or less, in view of bondability with the bonding members. If the thickness of these electrodes is smaller than 5 μm, the solder material, which is flattened out when the light-emitting device is placed on the supporting board, flows on to the supporting board, resulting in decrease in the amount of solder used for bonding, leading to reduction in thickness of the solder. Further, if the thickness of these electrodes is larger than 50 μm, the solder material, which is flattened out when the light-emitting device is placed on the supporting board, flows on to the supporting board, generating short-circuiting between those electrodes which must not be electrically connected.

In addition, in order to establish the above-noted self-alignment more assuredly, it is preferable that the proportion of ratio of the bonding area of the positive electrode 21 with the bonding member 30a, or more briefly, the surface area of the positive electrode 21, to the bonding area of the p-electrode with the bonding member 30a, or more briefly, the surface area of the p-electrode 13 is set appropriately. In the present invention, the bonding area proportion or ratio noted above is preferably 50% or more, but 100% or less (the bonding area ratio of 100% means that the bonding area of the positive electrode 21 with the bonding member 30a is equal to the bonding area of the positive electrode 21 with the bonding member 30a), more preferably 85% or more, but 100% or less. If the bonding area ratio is 85% or more, an additional advantage that the heat releasability can be enhanced as in the case of the bonding area ratio of 100% can be obtained.

Figure 5:
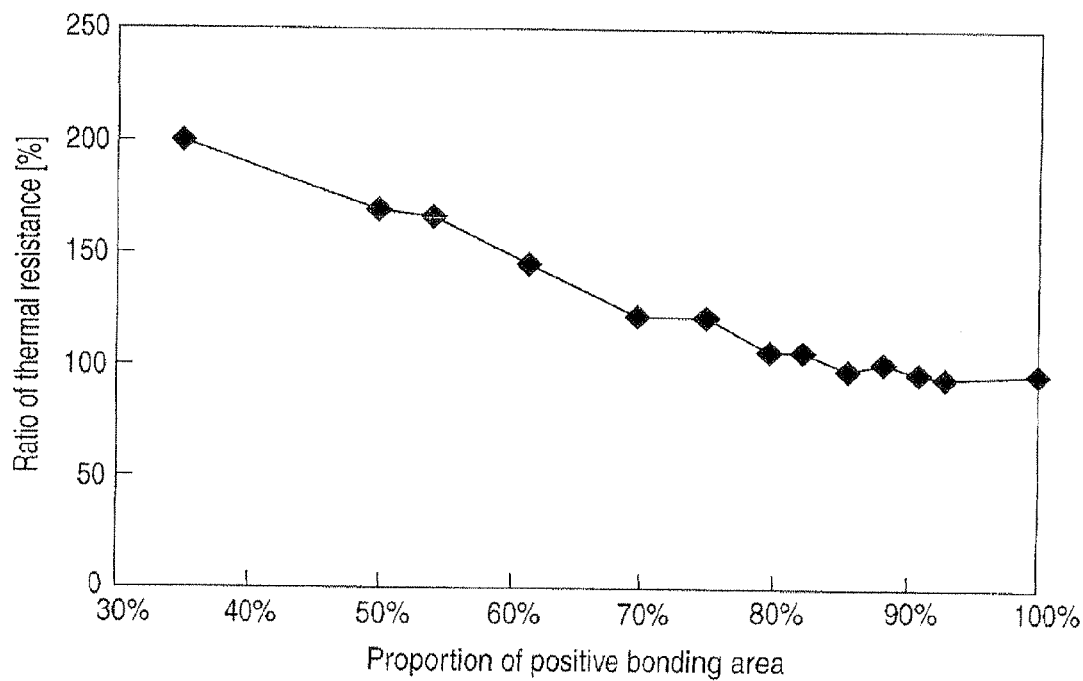
FIG. 5 is a graph illustrating a relationship between a thermal resistance ratio and a proportion or ratio of a bonding area of the positive electrode of the supporting board with the bonding member to a bonding area of the p-electrode of the light-emitting device with the bonding member.

FIG. 5 is a graph illustrating a relationship between a bonding area proportion or ratio described above and a thermal resistance ratio. Here, the bonding area ratio is a ratio of the bonding area of the positive electrode 21 with the bonding member 30a (or the surface area of the positive electrode 21) to the bonding area of the p-electrode 13 with the bonding member 30a (or the surface area of the p-electrode 13), in a light-emitting apparatus having the structure illustrated in FIG. 1. The thermal resistance ratio is a ratio of a thermal resistance at each bonding area ratio to a thermal resistance at the bonding area ratio of 100%. Note that each of the p-electrode and the positive electrode was a laminate with the uppermost layer being formed of Au, and the bonding members were made of AuSn. As can be seen from FIG. 5, it was confirmed that when the bonding area ratio is 85% or more, the heat releasability can be enhanced as in the case of the bonding area ratio of 100%.

Variation of First Embodiment

Figure 6:
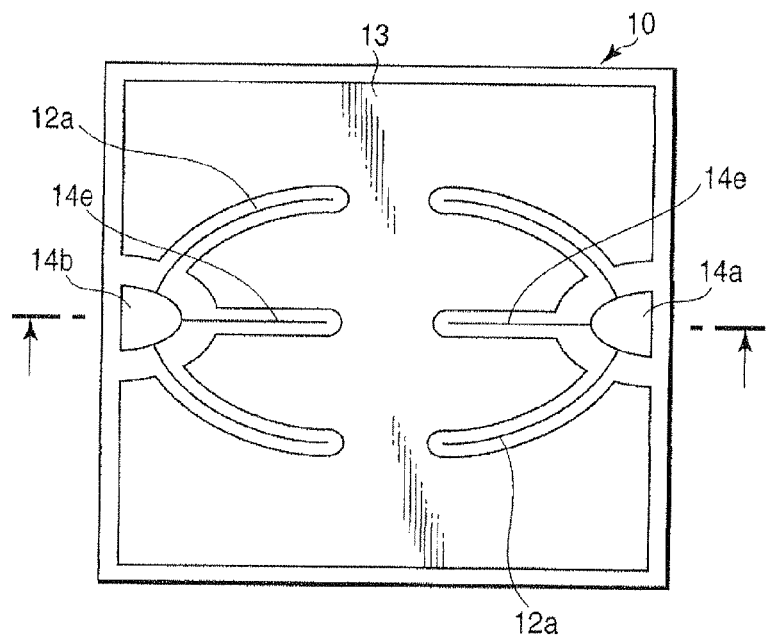
FIG. 6 is a plan view illustrating another electrode pattern on the electrode formation plane of the light-emitting device illustrated in FIG. 1.

FIG. 6 is a plan view illustrating another electrode pattern on the electrode formation plane of the light-emitting device illustrated in FIG. 1. In this electrode pattern, the p-electrode 13, and the pair of main n-electrodes 14a and 14b are the same as those illustrated in FIG. 3. However, there are additionally formed a fine auxiliary n-electrode 14e extending linearly from each of the main n-electrodes 14a and 14b toward the inside of p-electrode region, and two fine auxiliary n-electrode 14f and 14g which are symmetrical with respect to the auxiliary n-electrode 14e, and extend from each of the main n-electrodes 14a and 14b, each describing an arc. It is preferable that the electrode formation plane of the light-emitting device 10 is covered by an insulating protective film (not shown in FIG. 6) similar to the insulating protective film 15 illustrated in FIGS. 2 and 3. With this embodiment, the light-emitting efficiency can be further enhanced, since the number of n-electrodes is more than the first embodiment.

Second Embodiment

FIG. 7 is a cross-sectional view schematically illustrating the main part of a semiconductor light-emitting apparatus according to a second embodiment of the invention. The second embodiment differs from the first embodiment in that the surface area of each of the negative electrode 22a' and 22b' of the supporting board 20 is smaller than the surface area of each of the n-electrode 14a and 14b of the light-emitting device, and that that side face of each of the negative electrodes 22a' and 22b' which faces the positive electrode 22 is retracted outwardly from that side face of each of the n-electrode 14a and 14b which faces the p-electrode 13. Thus, the bonding area of the negative electrodes 22 of the supporting board with the bonding member 30a is smaller than the bonding area of the n-electrode 14a, 14b of the light-emitting device with the bonding members 30b', 30c'. With this arrangement, the same advantages as described with reference to the first embodiment. However, the distance between the positive electrode 21 and each of the negative electrodes 22a' and 22b' of the supporting board becomes larger. In addition, in the cross-section along the center line extending through the pair of n-electrodes and the p-electrode of the light-emitting device (the center line corresponding to the line I-I of FIG. 3), the side faces of the bonding members 30b' and 30c' bonding the n-electrode 14a and 14b of the light-emitting device with the negative electrodes 22a and 22b of the supporting board are formed tapered. Thus, the short-circuiting noted above is more assuredly prevented.

Third Embodiment

FIG. 8 is a cross-sectional view schematically illustrating a semiconductor light-emitting apparatus according to a third embodiment of the invention. FIG. 9 is a plan view illustrating an electrode pattern on the electrode formation plane of the light-emitting device 10' illustrated in FIG. 8. FIG. 10 is a plan view illustrating an electrode pattern on the electrode formation plane of the supporting board illustrated in FIG. 8. Here, FIG. 8 corresponds to a cross-section along the line VIII-VIII extending the n-electrode and the pair of p-electrodes and the center of the electrode formation plane.

The differs from the first embodiment in that an additional main n-electrode 14f is arranged at the central portion of the electrode formation plane of the light-emitting device 10', in addition to the main n-electrodes 14a and 14b (see FIG. 9), that the p-electrode is separated into a pair of p-electrodes 13a and 13b with these main n-electrodes therebetween, and that a pair of positive electrode 21a and 21b, and a negative electrode 22' are formed on the insulating substrate 23 of the supporting board 20, opposing to the a pair of p-electrode 13a and 13b. and the n-electrodes 14f, respectively. Here, the total area of the p-electrodes 13a and 13b is larger than the total area of the main n-electrodes, in order to enhance the light-emitting efficiency. Each of the p-electrodes 13a and 13b is of quadrangular planar shape, and extends to the four corner portions of the electrode formation plane of the light-emitting device. The main n-electrode 14f is formed in a substantially hexagonal planar shape at the central portion of the electrode formation plane of the light-emitting device. Further, two fine auxiliary n-electrodes 14g are formed, extending from the central main n-electrode 14f toward the regions of the p-electrodes 13a and 13b, respectively, and two fine auxiliary n-electrodes 14h are formed, extending from the n-electrode 14f toward the main n-electrodes 14a and 14b. Although not illustrated in FIGS. 8 and 9, an insulating protective film similar to the insulating protective film 15 illustrated in FIG. 2 is formed on the electrode formation plane of the light-emitting device 10. Incidentally, as illustrated in FIG. 9, the pair of p-electrodes covers the surface of the electrode formation plane substantially entirely, except for those surface portions on which the n-electrodes are formed.

On the other hand, the positive electrodes 21a and 21b of the supporting board 20" are formed in a rectangular planar shape, and oppose to the p-electrodes 13a and 13b. Also, the negative electrode 22' is formed in a rectangular planar shape at the central band region of the electrode formation plane of the supporting board. In the cross-section along the line VIII-VIII, each of the positive electrodes 21a and 21b has a width narrower than the width of each of the p-electrode 13a and 13b. In addition, the side face of each of the positive electrodes 21a and 21b which faces the negative electrode 14f is retracted outwardly from that side face of each of the p-electrodes 13a and 13b which faces the n-electrode 14f. Further, the negative electrode 22' opposes to the n-electrode 14f with the same width (or with a width narrower than the n-electrode 14f), in the cross-section along the line VIII-VIII.

Here, the bonding area of the positive electrodes 21a and 21b with the bonding member 30e and 30f are indicated as hatched areas in FIG. 8. Further, in order to illustrate the opposed state between the electrode formation plane of the supporting board 20" and the electrode formation plane of the light-emitting device 10', the periphery of the electrode formation plane of the light-emitting device 10 is indicated by the dashed line C in FIG. 9.

Variation of Third Embodiment

In the third embodiment, three (or more) fine auxiliary n-electrodes may be formed, extending from the central main n-electrode 14f radially into each of the regions of the p-electrodes 13a and 13b. With this arrangement, the light-emitting efficiency can be further enhanced, since the number of the n-electrodes is larger than the third embodiment.

The present invention will be described below by way of an Example. The present invention should not be limited to this Example. Needless to say, various modifications are possible.

Example 1

In a light-emitting apparatus of the structure illustrated in FIG. 1, the n-type semiconductor layer 121 of the light-emitting device is formed of Si-doped GaN, the active layer 122 is formed of InGaN, and the p-type semiconductor layer 123 is formed of Mg-doped GaN. The supporting board 20 is a co-fired alumina board. Each of the positive electrode 21 and the negative electrodes 22a, 22b on the supporting board 20 is formed of gold (Au), and each distance A is 100 µm. Each of the p-electrode 13 and the n-electrodes 14a, 14b on the light-emitting device 10 is formed of a Ti/Al/Ni/Au laminate with Ti contacting the semiconductor layer, and each distance B is 40 µm. The distance between lower surface of the electrodes on the supporting board 20 and the lower surface of the p-electrode 13 was 20 µm. Each bonding member was prepared from an AuSn solder, and each bonding member had a thickness of 20 µm. The thickness of each of the electrodes 21, 22a and 22b was 20 µm. The bonding area of the positive electrode 21 with the bonding member 30a is 90% of the bonding area of the p-electrode 13 with the bonding member 30a. This light-emitting apparatus was fabricated by the method described previously. With this arrangement, the apparatus could be fabricated with good self-alignment, and the electromigration could be suppressed assuredly.

The light-emitting apparatus of the present invention can be used in various fields, which require a light emission with a high output power and a high reliability, including a lighting device for vehicles.

What is claimed is:

1. A method of fabricating a semiconductor light emitting apparatus comprising a semiconductor light-emitting device having an electrode formation plane and comprising p- and n-electrodes in the electrode formation plane; a supporting board comprising an insulating substrate which has an electrode formation plane corresponding to the electrode of the light-emitting device and on which positive and negative electrodes are formed in the electrode formation plane thereof so as to oppose to the p- and n-electrodes, respectively; and bonding members bonding the p- and n-electrodes with the positive and negative electrodes, respectively, the method comprising:

supplying a bonding material in a paste state onto the electrode formation plane of the supporting board, including the positive and negative electrodes;

placing the light-emitting device on the bonding material such that the p- and n-electrodes of the light-emitting device contact the bonding material; and heating and melting the bonding material, thereby bonding the p- and n-electrodes on the light emitting device with the positive and negative electrodes on the supporting board, respectively, wherein the electrode formation plane is of a quadrangular shape, and the p-electrode of the light-emitting device extends to the four corners of the electrode formation plane.

2. The method according to claim 1, wherein the electrode formation plane of the light-emitting device substantially coincides with the electrode formation plane of the supporting board.

3. The method according to claim 1, wherein the positive electrode of the supporting board has a width smaller than that of the p-electrode of the light-emitting device, in a cross section extending through the p- and n-electrodes of the light-emitting device.

4. The method according to claim 1, wherein the bonding material is formed of a eutectic material including an AuSn.

5. The method according to claim 4, wherein the supporting board comprises an insulating substrate formed of a ceramic material, and a positive electrode and two negative electrodes, formed on the substrate.

6. The method according to claim 1, wherein the heating and melting is carried out by reflowing.

7. The method according to claim 1, wherein a pair of n-electrodes are disposed on both sides of the p-electrode with the p-electrode centered.

8. The method according to claim 7, wherein the n-electrodes on the light-emitting device are disposed at a central portion of the electrode formation plane of the light-emitting device.

9. The method according to claim 1, wherein the positive electrode on the supporting board is spaced apart from the negative electrode on the supporting board by a distance within a range of 10 μm or more, but 40 μm or less.

10. The method according to claim 1, wherein the p-electrode on the light-emitting device is spaced apart from the n-electrode on the light-emitting device by a distance within a range of 10 μm or more, but 40 μm or less.

11. The method according to claim 1, wherein each of the positive and negative electrodes on the supporting board has a thickness within a range of 5 μm or more, but 50 μm or less.

12. The method according to claim 1, wherein each of the positive and negative electrodes on the supporting board has a thickness within a range of 10 μm or more, but 30 μm or less.

13. A method of fabricating a semiconductor light emitting apparatus comprising a semiconductor light-emitting device having an electrode formation plane and comprising p- and n-electrodes in the electrode formation plane; a supporting board comprising an insulating substrate which has an electrode formation plane corresponding to the electrode of the light-emitting device and on which positive and negative electrodes are formed in the electrode formation plane thereof so as to oppose to the p- and n-electrodes, respectively; and bonding members bonding the p- and n-electrodes with the positive and negative electrodes, respectively, wherein the positive electrode of the supporting board has a width smaller than that of the p-electrode of the light-emitting device, in a cross section extending through the p- and n-electrodes of the light-emitting device,
the method comprising:
supplying a bonding material in a paste state onto the electrode formation plane of the supporting board, including the positive and negative electrodes;
placing the light-emitting device on the bonding material such that the p- and n-electrodes of the light-emitting device contact the bonding material; and
heating and melting the bonding material, thereby bonding the p- and n-electrodes on the light emitting device with the positive and negative electrodes on the supporting board, respectively.

14. The method according to claim 13, wherein the positive electrode on the supporting board is spaced apart from the negative electrode on the supporting board by a distance within a range of 10 μm or more, but 40 μm or less.

15. The method according to claim 14, wherein the p-electrode on the light-emitting device is spaced apart from the n-electrode on the light-emitting device by a distance within a range of 10 μm or more, but 40 μm or less.

16. The method according to claim 15, wherein each of the positive and negative electrodes on the supporting board has a thickness within a range of 5 μm or more, but 50 μm or less.

17. The method according to claim 15, wherein each of the positive and negative electrodes on the supporting board has a thickness within a range of 10 μm or more, but 30 μm or less.

18. The method according to claim 13, wherein the p-electrode on the light-emitting device is spaced apart from the n-electrode on the light-emitting device by a distance within a range of 10 μm or more, but 40 μm or less.

19. The method according to claim 13, wherein each of the positive and negative electrodes on the supporting board has a thickness within a range of 5 μm or more, but 50 μm or less.

20. The method according to claim 13, wherein each of the positive and negative electrodes on the supporting board has a thickness within a range of 10 μm or more, but 30 μm or less.

21. A method of fabricating a semiconductor light emitting apparatus comprising a semiconductor light-emitting device having an electrode formation plane and comprising p- and n-electrodes in the electrode formation plane; a supporting board comprising an insulating substrate which has an electrode formation plane corresponding to the electrode of the light-emitting device and on which positive and negative electrodes are formed in the electrode formation plane thereof so as to oppose to the p- and n-electrodes, respectively; and bonding members bonding the p- and n-electrodes with the positive and negative electrodes, respectively, wherein a pair of n-electrodes are disposed on both sides of the p-electrode with the p-electrode centered,
the method comprising:
supplying a bonding material in a paste state onto the electrode formation plane of the supporting board, including the positive and negative electrodes;
placing the light-emitting device on the bonding material such that the p- and n-electrodes of the light-emitting device contact the bonding material; and
heating and melting the bonding material, thereby bonding the p- and n-electrodes on the light emitting device with the positive and negative electrodes on the supporting board, respectively.

22. The method according to claim 21, wherein the n-electrodes on the light-emitting device are disposed at a central portion of the electrode formation plane of the light-emitting device.

23. A method of fabricating a semiconductor light emitting apparatus comprising a semiconductor light-emitting device having an electrode formation plane and comprising p- and n-electrodes in the electrode formation plane; a supporting board comprising an insulating substrate which has an electrode formation plane corresponding to the electrode of the light-emitting device and on which positive and negative electrodes are formed in the electrode formation plane thereof so as to oppose to the p- and n-electrodes, respectively; and bonding members bonding the p- and n-electrodes with the positive and negative electrodes, respectively, wherein the bonding material is formed of a eutectic material including an AuSn, and wherein the supporting board comprises an insulating substrate formed of a ceramic material, a positive electrode, and two negative electrodes, formed on the substrate,
the method comprising:
supplying a bonding material in a paste state onto the electrode formation plane of the supporting board, including the positive and negative electrodes;
placing the light-emitting device on the bonding material such that the p- and n-electrodes of the light-emitting device contact the bonding material; and
heating and melting the bonding material, thereby bonding the p- and n-electrodes on the light emitting device with the positive and negative electrodes on the supporting board, respectively.

24. The method according to claim 23, wherein the heating and melting is carried out by reflowing.

* * * * *